US008994039B2

(12) United States Patent
Donauer et al.

(10) Patent No.: US 8,994,039 B2
(45) Date of Patent: Mar. 31, 2015

(54) LIGHTING MODULE

(75) Inventors: Thomas Donauer, Kehlheim (DE); Robert Kraus, Regensburg (DE); Christine Maier, Asselfingen (DE); Giovanni Scilla, Fontane (IT); Steffen Strauss, Regensburg (DE)

(73) Assignee: OSRAM Gesellschaft mit beschraenkter Haftung, Munich (DE)

(*) Notice: Subject to any disclaimer, the term of this patent is extended or adjusted under 35 U.S.C. 154(b) by 557 days.

(21) Appl. No.: 13/147,824

(22) PCT Filed: Jan. 25, 2010

(86) PCT No.: PCT/EP2010/050792
§ 371 (c)(1), (2), (4) Date: Aug. 4, 2011

(87) PCT Pub. No.: WO2010/089218
PCT Pub. Date: Aug. 12, 2010

(65) Prior Publication Data

US 2011/0291125 A1 Dec. 1, 2011

(30) Foreign Application Priority Data

Feb. 4, 2009 (DE) ......................... 10 2009 007 430

(51) Int. Cl.

| | |
|---|---|
| ***H01L 29/18*** | (2006.01) |
| ***H01L 29/22*** | (2006.01) |
| ***F21S 4/00*** | (2006.01) |
| ***F21V 31/00*** | (2006.01) |
| *F21Y 101/02* | (2006.01) |

(52) U.S. Cl.
CPC ............... *F21S 4/006* (2013.01); *F21V 31/005* (2013.01); *F21Y 2101/02* (2013.01)
USPC .................................. 257/88; 257/98; 257/99

(58) Field of Classification Search
USPC .................................... 257/88, 89, 91, 98, 99
See application file for complete search history.

(56) References Cited

U.S. PATENT DOCUMENTS

| | | | | |
|---|---|---|---|---|
| 4,173,035 | A | 10/1979 | Hoyt | |
| 4,439,818 | A | 3/1984 | Scheib | |
| 6,074,074 | A | 6/2000 | Marcus | |
| 2004/0211966 | A1 | 10/2004 | Guenther et al. | |
| 2006/0062899 | A1 | 3/2006 | Rankin et al. | |
| 2006/0273304 | A1 | 12/2006 | Cok | |
| 2008/0157333 | A1* | 7/2008 | Lin et al. | 257/687 |

FOREIGN PATENT DOCUMENTS

| | | | |
|---|---|---|---|
| DE | 10350099 | A1 | 6/2005 |
| DE | 202006002728 | U1 | 5/2006 |
| EP | 0677695 | A2 | 10/1995 |
| EP | 0818652 | A2 | 1/1998 |
| WO | 2005099310 | A2 | 10/2005 |
| WO | 2007016224 | A1 | 2/2007 |
| WO | 2007149362 | A2 | 12/2007 |

OTHER PUBLICATIONS

English language abstract of DE 202006002728 U1.
English language abstract of DE 10350099 A1.
English language abstract of EP 0677695 A2.

* cited by examiner

*Primary Examiner* — Hung Vu

(57) ABSTRACT

A lighting module may include a lighting band with a band-shaped flexible substrate, wherein at least one semiconductor light source is applied to a top side of the substrate, wherein the lighting module is faced with a protective layer such that at least one emission area of the at least one semiconductor light source is exposed thereby.

11 Claims, 4 Drawing Sheets

LIGHTING MODULE

RELATED APPLICATIONS

The present application is a national stage entry according to 35 U.S.C. §371 of PCT application No.: PCT/EP2010/050792 filed on Jan. 25, 2010, which claims priority from German application No.: 10 2009 007 430.9 filed on Feb. 4, 2009.

TECHNICAL FIELD

Various embodiments relate to a lighting module and a method for the manufacture of a lighting module.

BACKGROUND

Flexible bands (LED Flex-bands) equipped with light-emitting diodes are known, which can be separated and are equipped with a self-adhesive rear face. Thus for example the LINEARlight Flex Series from Messrs. OSRAM GmbH is known, in which an LED band wound onto a roll may be obtained (for example the LM1X Series), wherein the entire module can comprise 120 to 600 LEDs depending on the model. The basic dimensions of the entire module (L×W×H) are 8400 mm×10 mm×3 mm. The basic dimensions of the smallest unit with 10 LEDs (L×W) are 140 mm×10 mm. The entire module can be separated into units of 10 LEDs or multiples thereof without loss of function of the individual pieces by means of careful cutting. The minimum bending radius of the LED bands is 2 cm. The LED band has a self-adhesive rear face. Upon assembly on a metallic underlay an insulation between underlay and LED band is to be provided in order to avoid short-circuits at the point of solder contacts of the substrate of the LED band.

As a means of protection against moisture or dust it is known that LED bands of the LED-Flex-series are completely provided with a protective varnishing, for example by means of a varnish APL from Messrs. Electrolube. The luminosity of the LED band can be negatively influenced as a result of aging of the protective layer on the semiconductor light source.

Further, silicon tubes (Messrs. Neo Neon) or a compound (Messrs. Vossloh Schwabe) are known as protective sheaths for LED bands of the LED-Flex series. In the case of these protective sheaths, there are limitations in relation to a possible total length (which are in particular severely limited in the case of a compound solution) and the modular separability and the associated requirement for sealing at the interface.

SUMMARY

Various embodiments provide a possible means of protection, e.g. the protection against mechanical stresses, as well as against dust and moisture, of LED bands, e.g. of Linearlight Flex products from Messrs. OSRAM, without impairing optical light properties. Various embodiments further provide a possible means of protection of LED bands, while maintaining reel-to-reel-manufacture).

The lighting module has a lighting band, in particular an LED band, with a band-shaped flexible substrate, wherein at least one semiconductor light source, in particular LED, is arranged at least on one side, in particular a front side, of the substrate. The lighting band can also have electrical and/or electronic components for lighting operation of the semiconductor light source(s), for example resistors and driver modules. The substrate can also be regarded as a flexible, band-shaped circuit board.

The lighting module is coated with a protective layer on its front side in such a way that at least one radiation emission surface of the at least one semiconductor light source is free from the protective layer. It is thereby achieved that the radiation from the semiconductor light source is not negatively influenced either in the short or long term by an aging protective layer. The lighting module is thus covered with the protective layer on a locally-selective basis.

Advantageously, the lighting module can be coated with a protective layer in the form of a varnish. Varnishes which may be considered are for example the varnishes "DSL 1600 E-FLZ/75" and "UG 10.173" manufactured by Messrs. Peters. The varnish can for example be applied by means of so-called film-coating or spray varnishing.

The protective layer further enables a full-coverage varnishing of conductor paths running across the substrate and electronic components located there, whereby these can be concealed. To this end the varnish can in particular be white (for example for lighting and backlighting applications) or black (for example for display applications). Alternatively, in particular for lighting and backlighting applications, the varnish can be transparent.

The varnish can have a thermal coefficient of expansion in the order of a thermal coefficient of expansion of a basic material of the substrate, preferably in the area of approx. 10 ppm/° C. Mechanical stress as a result of different thermal expansions, which could lead to the formation of splits is thereby avoided.

The lighting module can have an underlay for fixing to a rear face of the lighting band, in particular a flexible underlay. Upon being fixed to a rear face or underside the lighting module can thereby be protected, and fixing to rougher or soiled or damp underlays is also possible without causing problems. In practice this can be achieved by means of coating, in particular varnishing, only with difficulty. The underlay can further guarantee a more secure protection of the outer edges of the substrate, which can likewise only be realized with difficulty or not at all by means of coating, in particular varnishing alone. For good heat dissipation of the lighting band, the substrate lies flush on the underlay. The underlay can in particular be bonded to the flexible substrate with a double-sided adhesive band, for example a flexible pcb. In particular if the underlay protrudes by at least approx. 0.5 mm to 2 mm on each side, this can be varnished too.

For the dissipation of heat from the lighting band it is in particular preferable if the underlay has a highly heat-conductive ($\lambda \geq 15$ W/(m·K)) material, for example a metal or a highly heat-conductive plastic, in particular preferably aluminum or an aluminum/plastic composite material. A metal-plastic composite film guarantees electrical insulation, while a metal deposit or film enables a very good binding, which for better stability and greater resistance to abrasion can be embodied as an aluminum-plastic composite film. Besides aluminum, other highly conductive metals or metal mixtures can be used, for example a copper film or copper alloys. A glazed plastic film can also for example be used.

To achieve good flexibility at the same time as good heat dissipation and simple processing characteristics it is preferable if the underlay is no thicker than 150 μm. Due to its thinness, the Film is very pliable and contributes little to the rigidity of the protective sheath. A good thermal linkage of the semiconductor light sources to a subsurface for assembly of the lighting module can also be guaranteed.

The underlay can at least partially—preferably continuously—project laterally beyond the lighting band (that is be wider than the lighting band), wherein the underlay at least in a transitional area to the lighting band is faced with the protective layer.

For the provision of a lighting module which is non-sensitive and also well protected laterally against moisture it can be preferable if the underlay is wrapped around the lighting band, thus enclosing the latter in a forward direction from behind, around the edges of said lighting band.

Here, the protective layer on the front side can at least partially cover the beaded-over underlay, which enables a mechanically particularly stable and dense coverage. Alternatively or additionally, the beaded-over underlay at least partially need not be covered by the protective layer; the protective layer can then be applied to the surface of the front side not covered by the flange. A thermal insulation by means of the protective layer can thereby be avoided. Alternatively or additionally, the beaded-over underlay can cover the protective layer at the front at least partially, which enables mechanically stable and dense coverage.

In order to guarantee the adhesion of the protective layer, in particular of the varnish, a priming or activation of the surfaces to be covered can be provided for. Optionally, an adhesive band, for example a double-sided adhesive band can be attached underneath the underlay for fixing of the lighting module.

Instead of or in addition to a varnish, a stamped and deep-drawn covering film can be bonded to the flexible lighting band (and optionally to the rear film) as a protective layer.

The method serves the manufacture of a lighting module and has at least the following steps: (a) application of a multiplicity of LED bands to a common underlay; (b) coating of the bands and (c) separation of the bands with their respective underlays.

To apply the LED bands, these can for example be bonded, soldered, vulcanized, laminated, etc. parallel to the common underlay at a defined distance (preferably 1 mm to 4 mm). In general, however, the covering can be connected to the underlay by means of all known suitable jointing types, for example also by means of rolling, clamping, perforation, in particular microperforation, lock-seal jointing, smelting (welding), in particular by means of ultrasound welding, sticking etc. Particularly preferable is bonding of the lighting band onto the underlay, especially by means of the bonding of an in particular self-adhesive underside of the substrate of the lighting band onto the underlay.

By means of the coating as a combination, the process times can be considerably reduced. After the coating the complete bonded composite can be cured or sufficiently hardened, for example by means of heat treatment. The separation of the composite can be performed by means of any suitable means, for example by means of cutting, perforation, laser cutting, or other separation methods.

The spaces between the lighting bands can be fully varnished before the separation. Alternatively, the spaces between the lighting bands can have at least one varnish-free area, in particular varnish-free strips before the separation. The varnish-free areas can later, for example, be beaded over.

The coating can optionally also take place after the separation and also after a possible protection.

Furthermore, the LED bands can be populated before or after the separation. If the LED strips are already populated in the panel, that is after application of the lighting bands onto the underlay, and only subsequently separated, these can also be varnished before the separation. The rear face or at least the flank is then not varnished, which may however be sufficient for some applications.

The simple structure permits reel-to-reel manufacture. The lighting module can preferably continue to be separable, in particular by means of cutting.

BRIEF DESCRIPTION OF THE DRAWINGS

In the following figures the invention is described in greater detail in schematic form on the basis of exemplary embodiments. For the sake of greater clarity, the same elements or those with similar effects can here be provided with the same reference characters.

DETAILED DESCRIPTION

The following detailed description refers to the accompanying drawings that show, by way of illustration, specific details and embodiments in which the invention may be practiced.

Figure 1A:
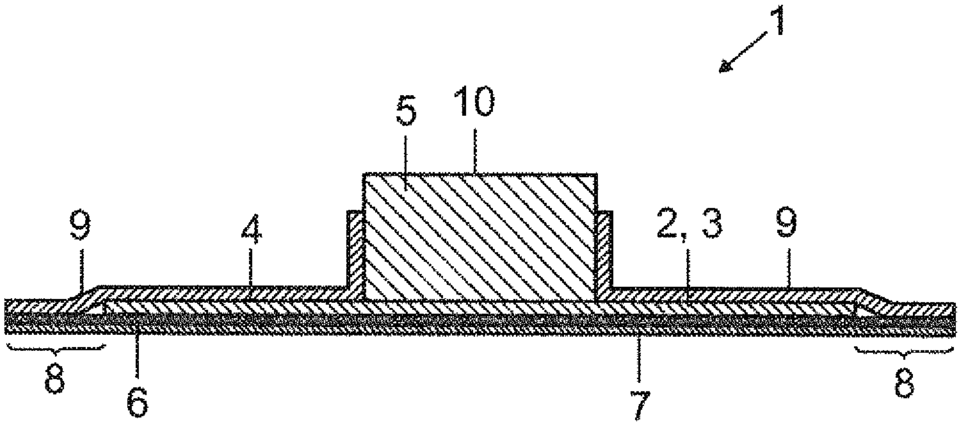
FIG. 1 shows in cross-sectional form (FIG. 1A) and seen from above, (FIG. 1B) a lighting module with a varnished lighting band according to a first embodiment.

FIG. 1A shows in cross-sectional form a lighting module in the form of an LED module 1 with a lighting band in the form of an LED band 2. The LED band 2 has a flexible substrate 3, on the top or front side 4 of which a white conversion LED 5 is mounted by way of example. Not shown, but likewise mounted on the top 4 are electronic components such as resistors and current drivers. The underside of the substrate 3 has a double-sided adhesive band 6. The LED band 2 can for example be embodied as an LED band of the LINEARlight Flex series produced by Messrs. OSRAM.

For manufacture of the LED module 1, the flexible LED band 2 with the adhesive band 6 is applied to a band-shaped underlay 7 in the form of a thin aluminum film made of pure aluminum or an aluminum composite material, and stuck there. The underlay 7 is so thin and thus so pliable (lacking in rigidity), that it does not significantly affect the flexibility of the LED band 2. As the width of the underlay 7 is here approx. 2 mm greater than that of the substrate 3, a projecting area 8 is created. On the top side 4 of the laterally projecting areas 8 and of the LED band 2 is located a protective layer in the form of a varnish coating 9. The varnish coating 9 covers the majority of the top of the LED module 1, including a major part of a lateral surface of the LED 5, but not an emission area 10 of the LED 5.

Figure 1B:
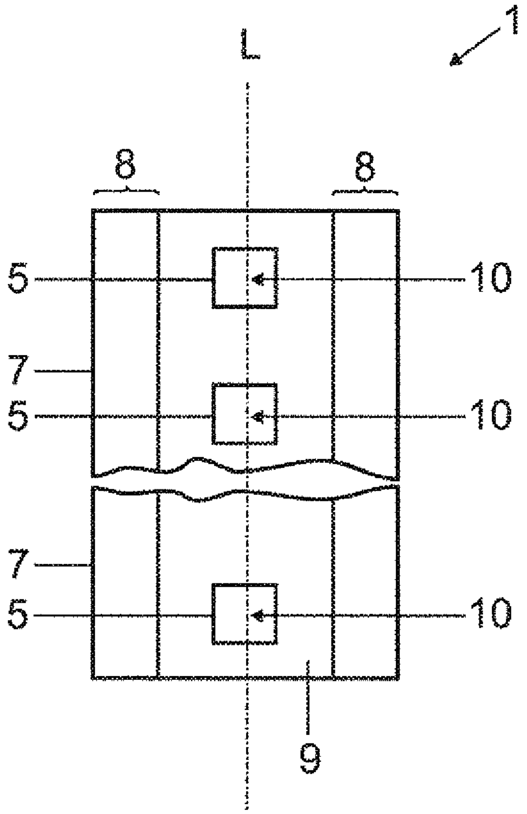

FIG. 1B shows the top side of the LED module 1 from FIG. 1A seen from above. The top side is almost completely coated with varnish 9, as indicated by the shaded area, and covers the substrate 3 and the underlay 7. Only the emission areas 10 of the LEDs 5 which extend equidistantly along the LED band 2 are not covered. In the case shown here, the varnishing is light-impermeably white and thus conceals the conductor paths and electronic components (upper figure) applied to the substrate (pcb) 3. The LED band 2 is thereby reliably protected except for the emission area 10, while radiation characteristics are not impaired by the varnishing 9, in particular in the event of aging of the varnishing 9.

Figure 2A:
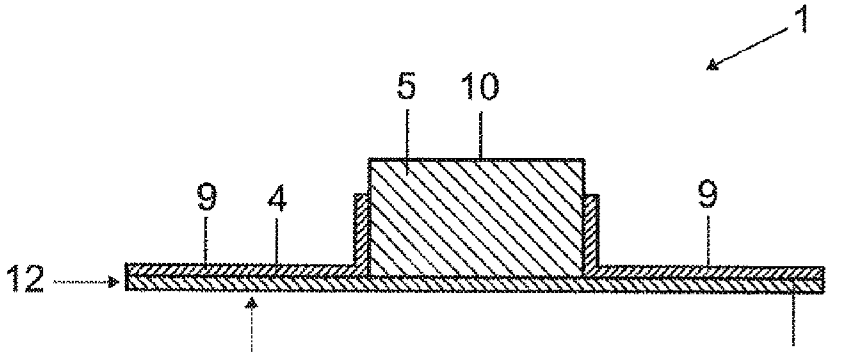
FIG. 2 shows in the FIGS. 2A to 2D in cross-sectional form lighting modules according to further embodiments.

FIG. 2A shows in cross-sectional form an LED module 11 according to a further embodiment with an LED band 2 as in FIG. 1, which now has no underlay and whose surface 4 is covered with the varnish 9. However both the sides and edges 12 of the substrate 3, as well as the underside 13 of the substrate 3 are varnish-free, as varnishing them is very laborious.

Figure 2B:
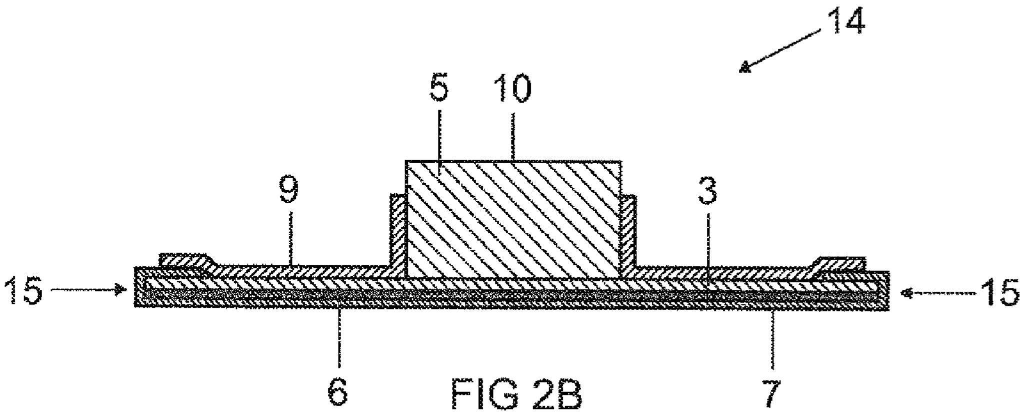

FIG. 2B shows in cross-sectional form an LED module 14 according to a further embodiment with an LED band 2 as in FIG. 1. For protection of the lateral edges and the underside of the substrate 3 this is applied with an underside flush with an underlay 7. The underlay 7 has on both sides a flange 15 encompassing the lateral edges of the substrate 3 in a forward direction. The layer of varnish 9 has been applied to the top side of both the flange 15 and the substrate 3 and thus inter alia prevents a penetration by harmful substances and particles between the underlay 7 and the substrate 3.

Figure 2C:
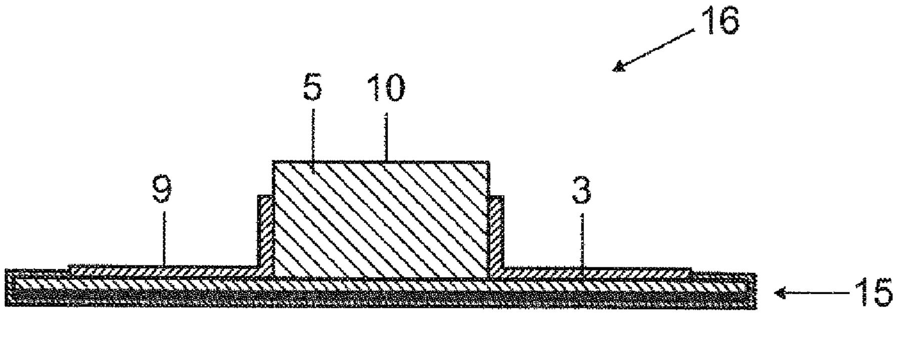

FIG. 2C shows an LED module 16, in which in contrast to LED module 14 from FIG. 2, the varnish 9 is applied on the top only of the substrate 3 and the side walls of LED 5, but not to the underlay 7 or its flange 15.

Figure 2D:
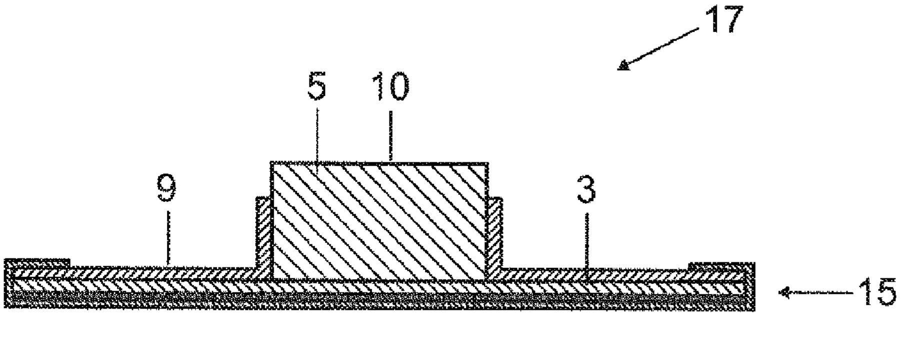

FIG. 2D shows an LED module 17, in which in contrast to LED module 14 from FIG. 2 the flange 15 covers the protective varnish 9 applied to the top of the substrate 3 and die side walls of the LED 5. This embodiment is particularly advantageous for a process sequence, as the LED module 17 can be varnished in the panel (see also FIG. 4). After a separation, the corners of the underlay 7 are bent upwards towards the flange 15.

Figure 3A:
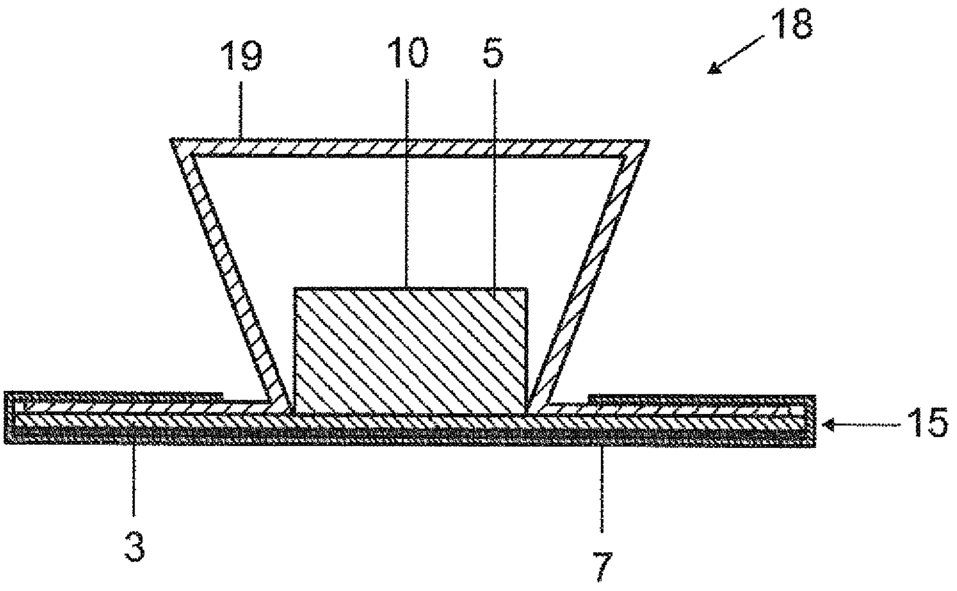
FIG. 3 shows in FIGS. 3A and 3B in cross-sectional form lighting modules according to further embodiments.

FIG. 3A shows an LED module 18, in which in contrast to the LED modules from FIG. 2 the LED 5 is covered by a protective sheath 19 which is light-permeable is at least on the top side. The protective sheath 19 lies flush on the substrate 3 laterally adjacent to the LED 5 auf. The flange 15 encompasses both the substrate 3 and also the part of the protective sheath 19 lying thereupon. The protective sheath 19 is thereby fixed on the LED band 2 and protects the LED band.

Figure 3B:
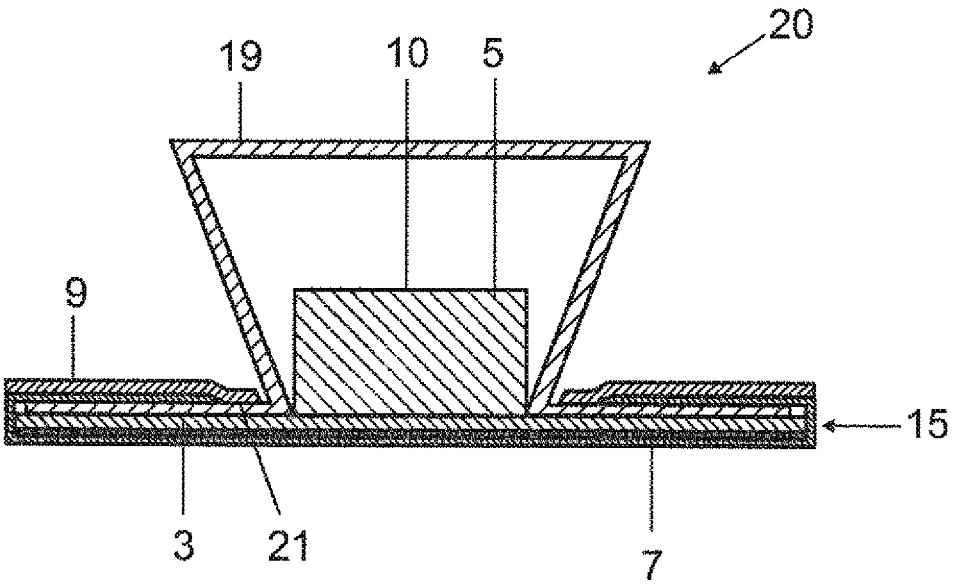

FIG. 3B shows an LED module 20, in which in contrast to LED module 18 from FIG. 3A the flange 15 and a possibly exposed area 21 of the part of the protective sheath 19 lying on the substrate 3 is covered on the top side with the protective varnish 9. A penetration of harmful substances or particles (such as small particles of dust etc.) under the protective sheath 19 is thereby prevented.

The light-permeable protective sheath 19 can at least partially be light-permeable, that is transparent or translucent, for example completely light-permeable. The light-permeable protective sheath 19 is preferably light-permeable in an area adjacent to a semiconductor light source and otherwise light-impermeable. A better-quality impression can thereby be achieved, in which essentially only the semiconductor light sources are visible from outside and not the conductor paths or further components.

Particularly preferable is a light-permeable protective sheath 19 with bulges for a semiconductor light source, in which the bulge is light-permeable, in particular transparent, and the light-permeable protective sheath 19 is otherwise light-impermeable.

In one embodiment, the light-permeable protective sheath 19 preferably has at least one optical element for guidance of the light beamed from the LED band 2 for improvement of the optical emission characteristics. This is preferably located above a position provided for the LED or LEDs 5, in particular at the tip of a bulge for an LED 5.

Figure 4:
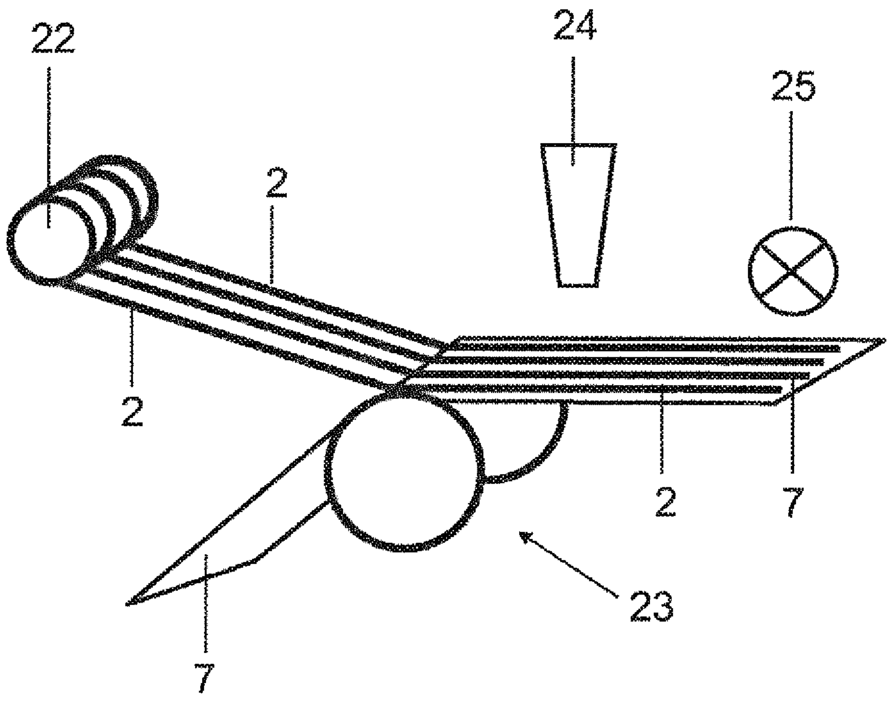
FIG. 4 outlines steps in the manufacturing sequence of a lighting module, in particular according to a lighting module as shown in one of the FIGS. 1 to 3.

FIG. 4 outlines various stations of a production line for reel-to-reel manufacture of an LED module, wherein the manufacturing proceeds from left to right. The production line has an endless drum 22 with four LED bands 2 separately rolled thereupon. The LED bands 2 are conveyed to a lamination station 23, where they are attached to the underlay 7 in parallel by means of bonding. The combination of LED bands 2 and underlay 7 is also known as a panel.

The underlay 7 likewise originates from an endless roll (not shown here). After the lamination station 23 there follows a varnishing station 24, in which the panel 2, 7 is sprayed with varnish over its full top surface. The varnish is at least partially cured in a downstream curing station 25. In a still further cutting station 26, the panel 2, 7 is cut up, in order to separate the individual LED modules (upper fig.).

The present invention is of course not restricted to the exemplary embodiments shown.

The underlay can also thus be comparatively rigid, for example by having a greater thickness.

Instead of white conversion LEDs, the lighting device may for example also have LED modules with a multiplicity of individual LED chips ('LED-cluster'), which together can generate a white blended light, for example in 'cold white' or 'warm white'.

To generate a white blended light, the LED cluster preferably comprises light-emitting diodes, which illuminate in the primary colors red (R), green (G) and blue (B). Here, individual or multiple colors can also be generated at the same time by a multiplicity of LEDs; the combinations RGB, RRGB, RGGB, RGBB, and RGGBB etc. are possible. However, the color combination is not limited to R, G and B (and A). To generate a warm white tone, one or more 'amber' (A) LEDs can for example also be present. In the case of LEDs with different colors these can preferably be actuated in such a way that the LED module selectively emits light in a tunable RGB color range.

In general, any other suitable semiconductor emitter can also be used, such as a laser diode, in addition to or instead of an LED.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

LIST OF REFERENCE CHARACTERS

1 LED module
2 LED band
3 Substrate
4 Top
5 LED
6 Double-sided adhesive band
7 Underlay
8 Projecting area of the underlay
9 Layer of varnish
10 Emission area
11 LED module
12 Edge of the substrate
13 Underside of the substrate
14 LED module
15 Flange
16 LED module
17 LED module
18 LED module
19 Light-permeable protective sheath

20 LED module
21 Exposed area of the protective sheath
22 Endless drum
23 Lamination station
24 Varnishing station
25 Curing station
26 Cutting station

The invention claimed is:

1. A lighting module, comprising:

a lighting band with a band-shaped flexible substrate, wherein at least one semiconductor light source is applied to a top side of the substrate, wherein the lighting module is faced with a protective layer such that at least one emission area of the at least one semiconductor light source is exposed thereby, further comprising: an underlay for fixing a rear side of the lighting band, wherein the underlay is around the lighting band.

2. The lighting module as claimed in claim 1, which is coated with the protective layer in the form of a varnish.

3. The lighting module as claimed in claim 1, wherein the protective layer is black, white or transparent.

4. The lighting module as claimed in claim 1, wherein the protective layer has a thermal coefficient of expansion in the order of magnitude of a thermal coefficient of expansion of a basic material of the substrate.

5. The lighting module as claimed in claim 1, wherein the underlay at least partially protrudes laterally beyond the lighting band, wherein the underlay is faced with the protective layer at least at a transitional area to the lighting band.

6. The lighting module as claimed in claim 1, wherein on the top side the beaded-over underlay is at least partially covered by the protective layer, the beaded-over underlay is at least partially not covered by at least one of the protective layer and the beaded-over underlay at least partially covers the protective layer.

7. The lighting module as claimed in claim 1, wherein the underlay has a highly heat-conductive material.

8. The lighting module as claimed in claim 7, wherein the highly heat-conductive material comprises aluminum or an aluminum/plastic-composite material.

9. The lighting band as claimed in claim 1, wherein the underlay is not thicker than 150 μm.

10. The lighting module as claimed in claim 1, wherein the lighting band is a light emitting diode band.

11. The lighting module as claimed in claim 1, wherein the at least one semiconductor light source comprises a light emitting diode.

* * * * *